United States Patent
McCordic et al.

(10) Patent No.: US 10,791,654 B2
(45) Date of Patent: Sep. 29, 2020

(54) MULTI-PURPOSE COOLANT INTERFACE

(71) Applicant: Raytheon Company, Waltham, MA (US)

(72) Inventors: Craig H. McCordic, Medfield, MA (US); Joseph R. Ellsworth, Worcester, MA (US); Todd Southard, Bolton, MA (US); Douglas Moriondo, Shrewsbury, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/038,073

(22) Filed: Jul. 17, 2018

(65) Prior Publication Data

US 2020/0029469 A1    Jan. 23, 2020

(51) Int. Cl.
| | |
|---|---|
| *H05K 7/20* | (2006.01) |
| *G01S 7/03* | (2006.01) |
| *H01Q 21/00* | (2006.01) |
| *H01R 13/73* | (2006.01) |

(52) U.S. Cl.
CPC ......... *H05K 7/20763* (2013.01); *G01S 7/032* (2013.01); *H01Q 21/0025* (2013.01); *H01R 13/73* (2013.01)

(58) Field of Classification Search
CPC ............................ H05K 7/20763; F16L 37/26
See application file for complete search history.

(56) References Cited

U.S. PATENT DOCUMENTS

| | | | | |
|---|---|---|---|---|
| 6,918,952 B2 * | 7/2005 | Van der Maas | ... | B01D 53/0415 210/234 |
| 7,717,470 B1 * | 5/2010 | Pluymers | ................ | F16L 55/07 285/13 |
| 10,164,373 B1 * | 12/2018 | Cheon | .................... | H01R 43/26 |

(Continued)

FOREIGN PATENT DOCUMENTS

JP    2008135472 A    6/2008

OTHER PUBLICATIONS

"7 Fast Facts About the Navy's Newest Radar—AMDR Will Help Keep the World a Safer Place", Raytheon Company, Feb. 1, 2018, 4 pages.

(Continued)

*Primary Examiner* — Mukundbhai G Patel

(57) ABSTRACT

A coolant interface includes a line replaceable unit (LRU) inserted into a slot within a modular assembly such as a chassis for an electronics assembly. Quick disconnect fluid coupling fittings on the LRU mate with counterpart fittings on a fluid distribution manifold within the chassis when the LRU is inserted into the slot. A seal surrounding the quick disconnect fluid coupling fittings on a flat surface abutting a counterpart surface on the fluid distribution manifold when the LRU is inserted into the slot compresses the seal against the counterpart surface. Alignment pin(s) projecting from the flat surface and received by corresponding guide holes within the counterpart surface, and captive hardware provides pressure between the flat surface and the counterpart surface to increase and maintain compression of the seal. The alignment pins and captive hardware are arranged to increase mechanical stability of the connection.

20 Claims, 5 Drawing Sheets

(56) References Cited

U.S. PATENT DOCUMENTS

2009/0219692 A1    9/2009   Wavering et al.

OTHER PUBLICATIONS

"MX-10D" Technical Specification, L3 WESCAM, Jan. 2018, 2 pages.
"O-Ring Face Seal Design", Pressure Connections Corp., Feb. 2014, pp. 174-201.
International Search Report and Written Opinion of the International Searching Authority in connection with International Patent Application No. PCT/US2019/041044 dated Oct. 9, 2019, 10 pages.

* cited by examiner

MULTI-PURPOSE COOLANT INTERFACE

TECHNICAL FIELD

The present disclosure is directed in general to cooling large radar arrays and, more particularly, to improving a coolant interface for such arrays.

BACKGROUND OF THE DISCLOSURE

Customers are seeking higher power radars to keep pace with increasingly sophisticated threats. However, next-generation radar power levels exceed the capability of cost effective conduction cooling methods and require liquid cooled line replaceable units (LRUs) to support increased radio frequency (RF) performance while providing high reliability electronics.

SUMMARY OF THE DISCLOSURE

In one embodiment of the disclosure, a coolant interface includes a line replaceable unit configured to be inserted into a slot within a modular assembly such as a chassis for a radar module assembly or a computer. The line replaceable unit includes quick disconnect fluid coupling fittings configured to mate with counterpart fittings on a fluid distribution manifold within a chassis for the modular assembly when the line replaceable unit is inserted into the slot within the modular assembly. The line replaceable unit also includes a seal surrounding the quick disconnect fluid coupling fittings on a flat surface, the flat surface configured to abut a counterpart surface on the fluid distribution manifold when the line replaceable unit is inserted into the slot within the modular assembly and to compress the seal against the counterpart surface. The line replaceable unit preferably includes one or more alignment pins projecting from the flat surface and configured to be received by one or more corresponding guide holes within the counterpart surface, as well as captive hardware configured to provide pressure between the flat surface and the counterpart surface to increase and maintain compression of the seal between the flat surface and the counterpart surface surrounding the seal. The one or more alignment pins and the captive hardware are preferably arranged at four corners of the flat surface. The one or more alignment pins may each have a partially tapered end, and the captive hardware may be in the form of threaded screws. The line replaceable unit should include a cooling structure configured to receive coolant from the fluid distribution manifold via the quick disconnect fluid coupling fittings, circulate the coolant proximate to electronics mounted on the line replaceable unit, and return the circulated coolant to the fluid distribution manifold via the quick disconnect fluid coupling fittings. One or more heat sinks may be mounted on the cooling structure to support electronics. The chassis for the modular assembly preferably includes a plurality of slots each configured to receive a line replaceable unit, and the fluid distribution manifold preferably includes the counterpart fittings in a plurality of locations each positioned, relative to one of the plurality of slots, to align and mate with the quick disconnect fluid coupling fittings on the line replaceable unit when the line replaceable unit is inserted into the respective one of the plurality of slots. The fluid distribution manifold should be configured to circulate coolant to each line replaceable unit inserted into any of the plurality of slots but otherwise retain the coolant.

In another embodiment of the disclosure involving a method of operating a coolant interface, when a line replaceable unit is inserted into a slot within a modular assembly such as a chassis for a radar module assembly or a computer, quick disconnect fluid coupling fittings on the line replaceable unit are mated with counterpart fittings on a fluid distribution manifold within a chassis for the modular assembly when the line replaceable unit is inserted into the slot within the modular assembly, and a seal surrounding the quick disconnect fluid coupling fittings between a flat surface and a counterpart surface on the fluid distribution manifold. One or more alignment pins projecting from the flat surface, if present, are inserted into one or more corresponding guide holes within the counterpart surface. Captive hardware, if included, provides pressure between the flat surface and the counterpart surface to increase and maintain compression of the seal between the flat surface and the counterpart surface. The one or more alignment pins and the captive hardware are preferably arranged at four corners of the flat surface surrounding the seal. The one or more alignment pins each may have a partially tapered end, and the captive hardware may be in the form of threaded screws. Coolant is received in a cooling structure for the line replaceable unit from the fluid distribution manifold via the quick disconnect fluid coupling fittings, circulated proximate to electronics mounted on the line replaceable unit, and returned to the fluid distribution manifold via the quick disconnect fluid coupling fittings. One or more heat sinks may be mounted on the cooling structure to support the electronics. The chassis for the modular assembly includes a plurality of slots each configured to receive a line replaceable unit, and wherein the fluid distribution manifold includes the counterpart fittings in a plurality of locations each positioned, relative to one of the plurality of slots, to align and mate with the quick disconnect fluid coupling fittings on the line replaceable unit when the line replaceable unit is inserted into the respective one of the plurality of slots. Coolant from the fluid distribution manifold should be circulated to each line replaceable unit inserted into any of the plurality of slots but otherwise retained.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
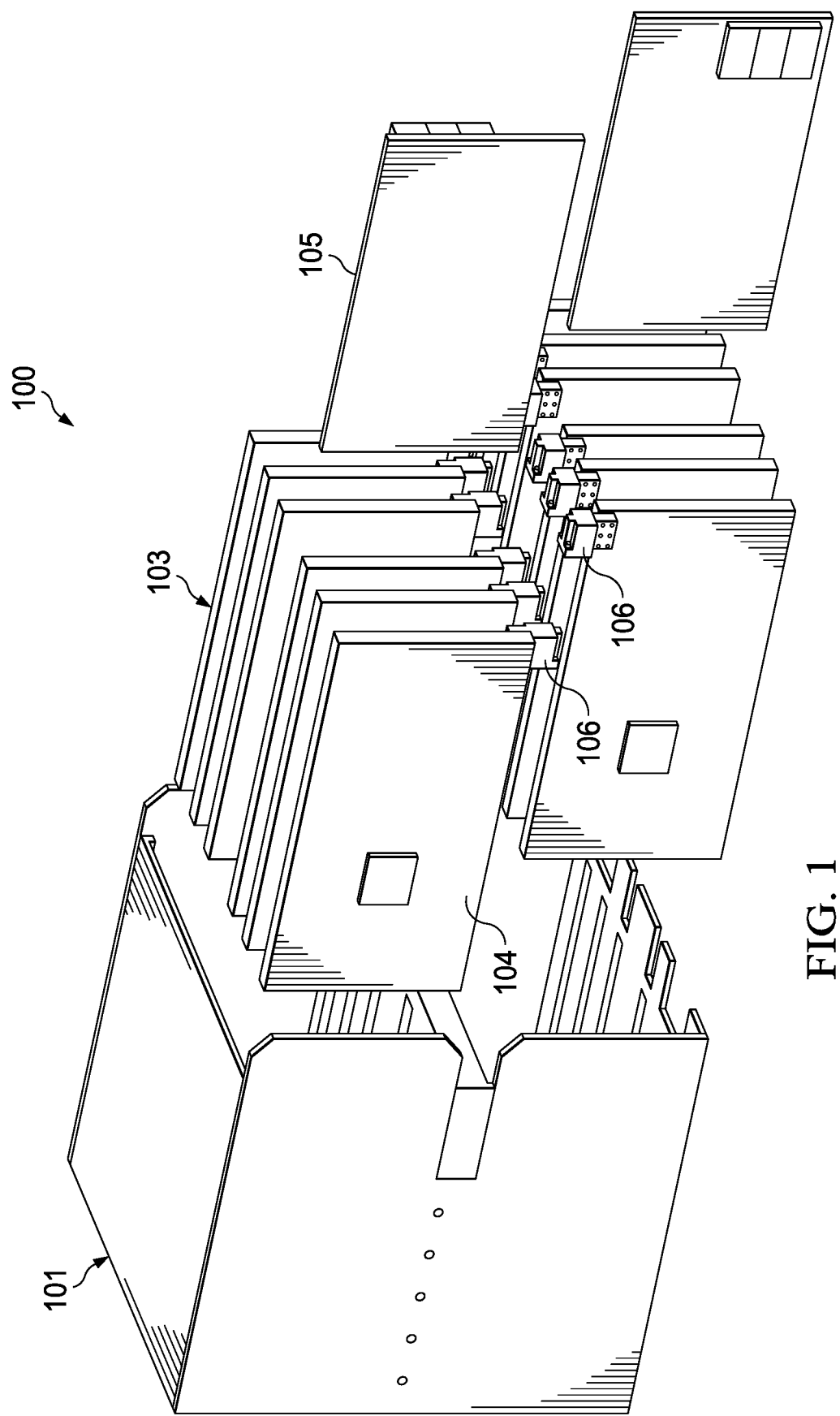
FIG. 1 is an illustration of one environment in which a multi-purpose coolant interface in accordance with embodiments of the present disclosure may be implemented.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below. Additionally, unless otherwise specifically noted, articles depicted in the drawings are not necessarily drawn to scale.

In conventional conduction cooled electronics assemblies, each LRU is conduction cooled by a liquid-cooled heatsink, typically via an edge connection. Increasing operating power above existing levels may push the electronics beyond acceptable operating temperatures. Liquid cooling of the individual assemblies could allow increased operating power. In addition, the cost effective limits of conduction cooling appear to have been reached and are beginning to hinder increased radar capability, such that (for example) high power electronic assemblies must be constrained in performance or even scaled back to avoid excessive device temperatures under stressing environmental conditions.

In designing a coolant interface for liquid cooling of individual assemblies within large arrays of assemblies, one challenge is enabling the convenience of a quick disconnect for easy maintenance while also ensuring there are no leaks during operation. Despite claims to the contrary, quick-disconnect (QD, also known as "quick connect" or "quick release") fittings for providing a fast (relative to threaded or flanged connections), make-or-break connection of fluid transfer lines have a tendency to leak when used in large quantities, at least after extended use, repeated connection/disconnection, or use under widely varying temperature conditions.

In the present disclosure, a liquid-cooled heatsink is part of each line replaceable unit (LRU) and each LRU assembly receives coolant in parallel from a coolant distribution manifold within the chassis assembly into which the LRUs are inserted. Quick disconnect fittings enable the liquid cooling of the LRUs, with O-ring face seals ensuring no coolant fluid leaks during operation while still allowing easy installation and maintenance. The significantly improved cooling and thermal capability of liquid-cooled LRUs enables higher power levels and increased functionality, as well as increasing electronics reliability.

FIG. 1 is an illustration of one environment in which a multi-purpose coolant interface in accordance with embodiments of the present disclosure may be implemented. In the example shown, the coolant interface is employed within an electronics assembly in which individual line replaceable units are assembled to make a larger and/or higher processing power radar array. However, those skilled in the art will recognize that the coolant interface of the present disclosure may also be employed in any environment in which liquid cooling of electronics with easy maintenance but no leaks during operation would be beneficial, such as the processing cards in massively parallel processing systems. In addition, for simplicity and clarity, only partial details of the exemplary environment are shown and described, although those skilled in the art will recognize that the complete electronics assembly and the line replaceable units therein will include features not mentioned or specifically shown.

The electronics assembly 100 of FIG. 1 includes a chassis assembly 101 that receives line replaceable units (LRUs) 103 each containing electronics components and circuits. In the example shown, the chassis assembly 101 is designed to receive multiple LRUs 103 in two rows. The chassis assembly 101 may also receive other types of circuitry 105. The LRUs 103 are each received by one of a plurality of "slots" on the chassis assembly by (for example) sliding along guides or rails not visible in FIG. 1.

Each LRU 103 includes a coolant interface 106. The location of the coolant interface 106 on an LRU 103 and its orientation relative to the remainder of the respective LRU 103 may be consistent for at least some subsets of the LRUs 103. In the example shown, the coolant interface 106 for each LRU 103 on the top row is on the bottom front corner (relative to the orientation of the respective LRU 103 when inserted into the chassis assembly 101) of that LRU 103, while the coolant interface 106 for each LRU 103 on the bottom row is on the top front corner of that LRU 103. For LRUs 103 on both rows, the coolant interface 106 projects out from an edge (bottom or top) of the respective LRU 103, with the connection region facing toward the chassis assembly 101. When the LRU 103 is fully inserted into the chassis assembly 101, the connection region abuts and connects to a counterpart connection region on a coolant distribution manifold within the chassis assembly 101 as described in further detail below.

Figure 1A:
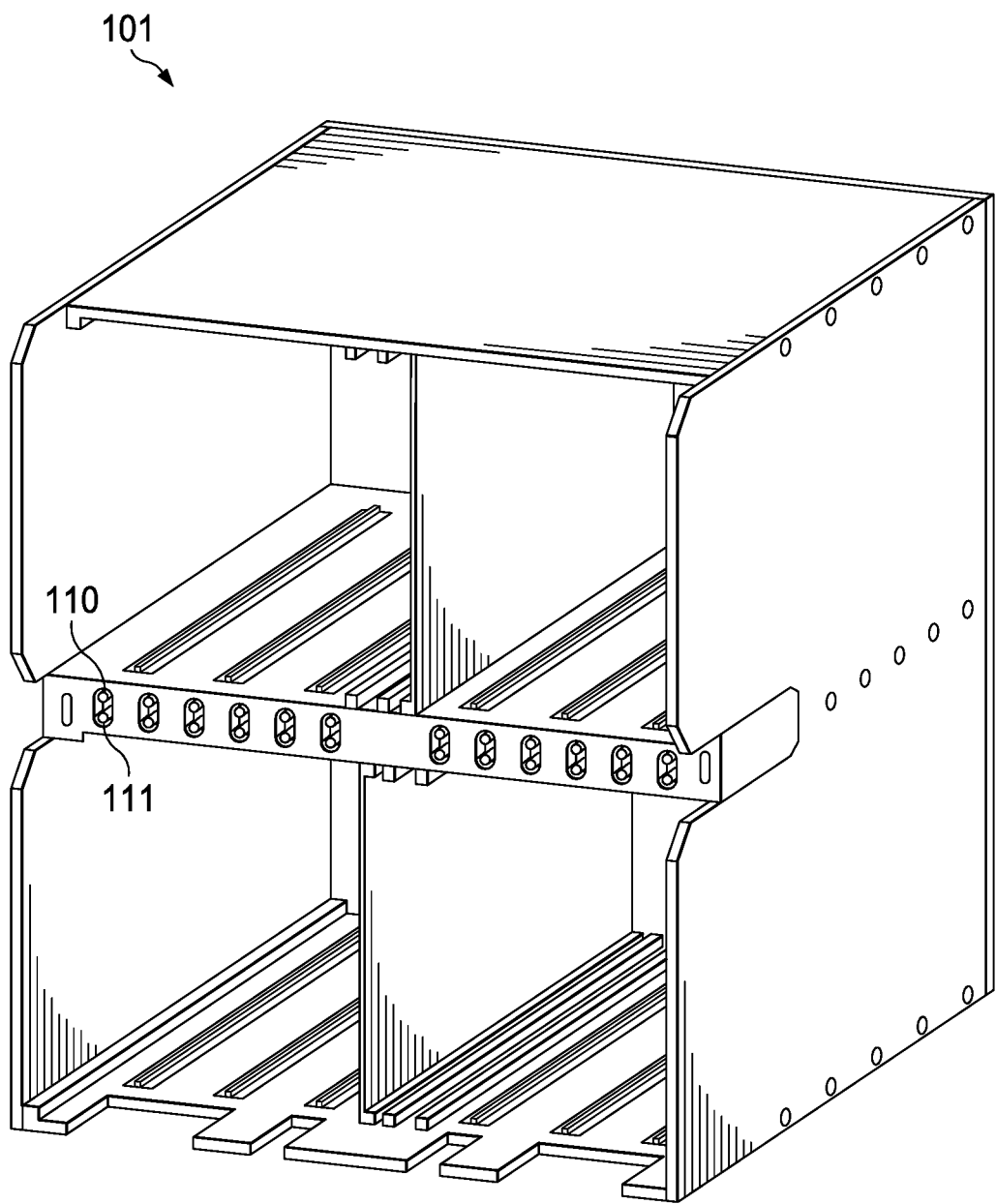
FIG. 1A is an alternate view showing additional details of the chassis assembly featuring the multi-purpose coolant interface shown in FIG. 1.

FIG. 1A is an alternate view showing additional details of the chassis assembly within the multi-purpose coolant interface shown in FIG. 1. The chassis assembly 101 includes, mounted therein, a coolant distribution manifold 110, which includes a plurality of quick disconnect interfaces 111 each positioned to align with a quick disconnect block for the coolant interface 106 on an LRU 103 when inserted into a corresponding slot of the chassis assembly 101. Each quick disconnect interface 111 may include male fittings, female fittings or a combination of each, and may be positioned within a recess designed to receive a portion of the quick disconnect block for the coolant interface 106 on the respective LRU 103.

Figure 1B:
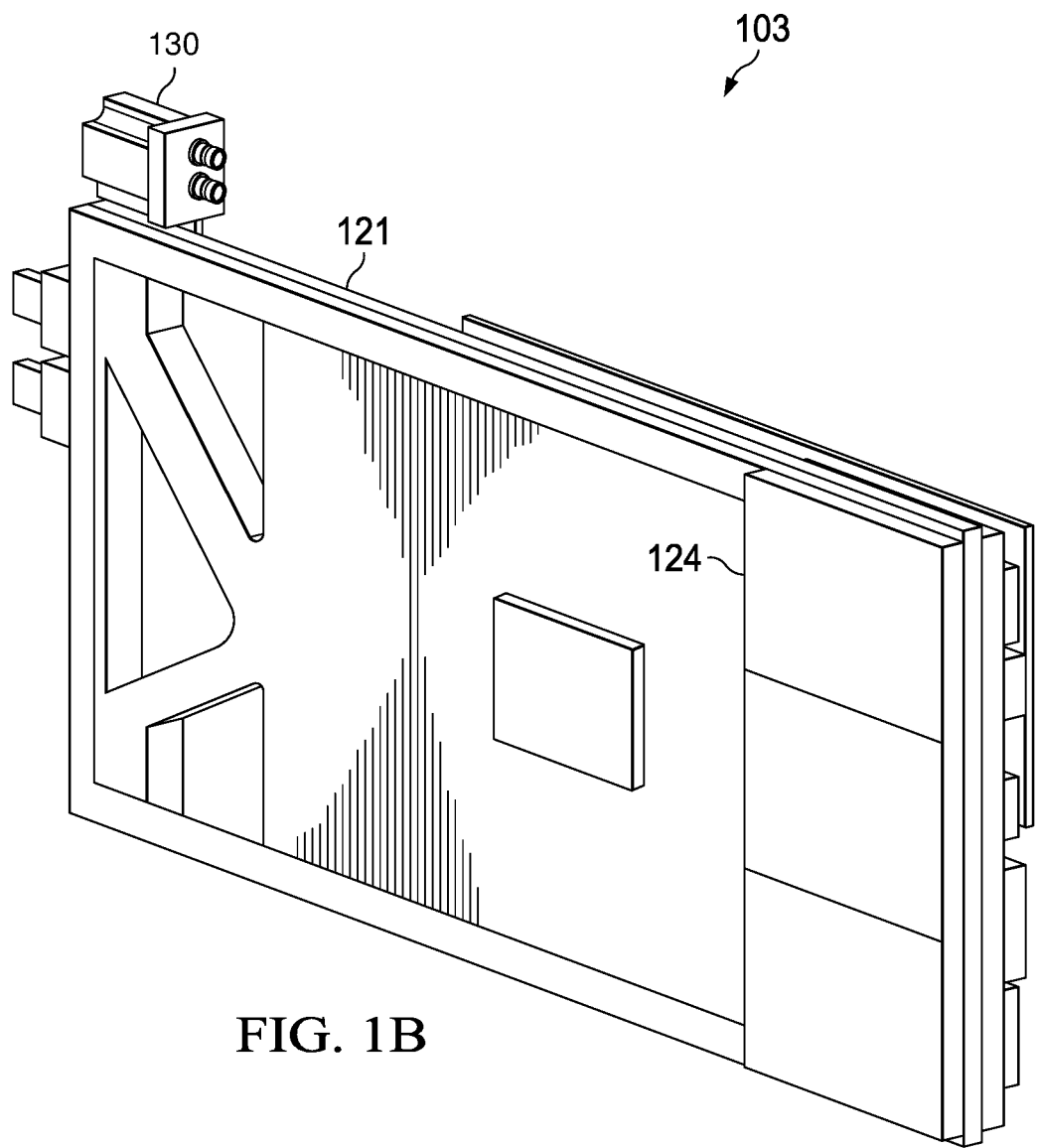
FIG. 1B is an exploded view of a line replaceable unit featuring the multi-purpose coolant interface shown in FIG. 1.

FIG. 1B shows the line replaceable unit (LRU) within the multi-purpose coolant interface shown in FIG. 1. Each LRU 103 includes a quick disconnect block 130 that mates with the quick disconnect interface 111 on the coolant distribution manifold 110 when LRU 103 is inserted into the respective slot, and which is in fluid communication with a liquid cooled brazement 121 (or similar structure containing fluid paths) on which is mounted a heatsink 122 and heatsink(s) 123. Circuits are mounted in thermal communication with and cooled by the heatsink 122, and circuits are mounted in thermal communication with and cooled by the heatsink(s) 123. Heatsink 122 and heatsink(s) 123, in turn, are in thermal communication with and cooled by the liquid cooled brazement 121, and in particular by cooling fluid circulating within the liquid cooled brazement 121. A plurality of electronic components 124 are also mounted in thermal communication with and cooled by the liquid cooled brazement 121 in the example of FIG. 1B.

The cooling fluid circulating within the liquid cooled brazement 121 flows into the brazement 121 from the coolant distribution manifold 110 in the chassis assembly 101, circulates within the brazement 121 to absorb heat from the heatsink 122 and/or heatsink(s) 123, and returns to the coolant distribution manifold 110 to be replaced by cooler fluid.

Figure 1C:
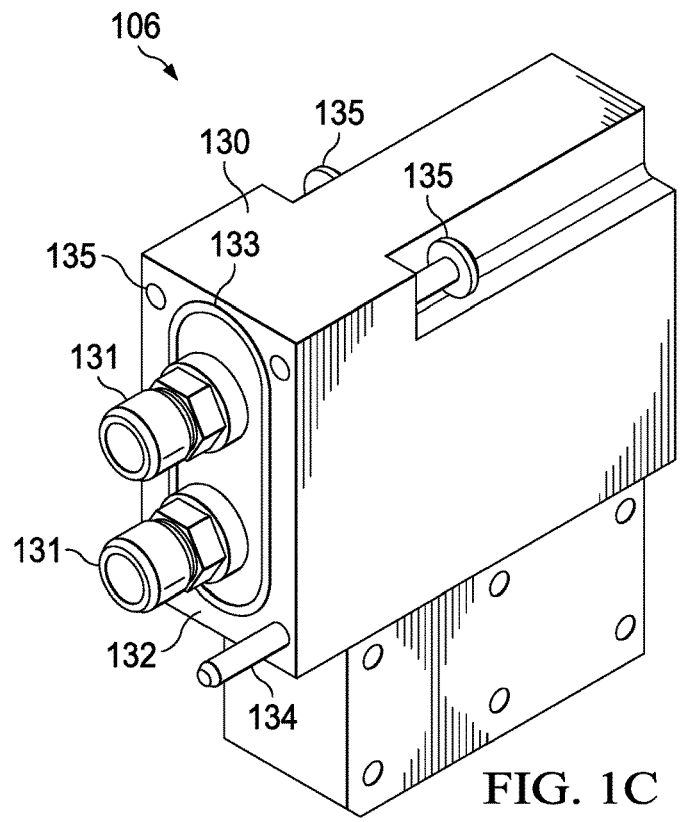
FIG. 1C is an enlarged view of the coolant interface on each line replaceable unit in FIGS. 1 and 1B.

FIG. 1C is an enlarged view of the coolant interface on each LRU in FIGS. 1 and 1B. The coolant interface 106 includes a quick disconnect block 130 that, when the respective LRU 103 is inserted into a slot of the chassis assembly 101, may be at least partially received within a recess within one of the quick disconnect interfaces 111 of the coolant distribution manifold 110 on the chassis assembly 101. Mounted on the quick disconnect block 130 are quick disconnect fittings 131 that mate with counterpart quick disconnect fittings when aligned with one of the quick disconnect interfaces 111 of the coolant distribution manifold 110 when the LRU 103 is inserted into a slot within the chassis assembly 101. A flat surface 132 of the quick disconnect block 130 around the quick disconnect fittings 131 supports seal 133. The seal 133 may be around one, two, or more quick disconnect fittings 131. Depending upon the application, the seal 133 may be an O ring with a circular cross-section or a compressed gasket with a rectangular cross-section, or may be a comparable type seal with a different cross-section. The seal 133 and the surrounding flat surface 132 seal the connection between the coolant interface 106 and the quick disconnect interfaces 111, ensuring no significant fluid leaks during operation of the electronics assembly while still allowing (because of the quick disconnect fittings) easy insertion and removal of the LRU 103 into and from a chassis assembly slot for installation and/or maintenance. Because the seal prevents (or at least minimizes or reduces) leaks during operation, all that remains is a possibility for minor leaks of small amounts of fluid during maintenance, which are manageable and/or tolerable.

A tapered-ended alignment pin 134 projects from the quick disconnect block 130 and is received by a corresponding guide hole in one of the quick disconnect interfaces 111 on the coolant distribution manifold 110 of the chassis assembly 101, to guide the path of travel of the quick disconnect block 130 during insertion of the corresponding LRU 103 into a chassis assembly slot and facilitate proper mating of the quick disconnect fittings. In addition to facilitating alignment for proper mating of the quick disconnect fittings, alignment pin 134 (together with the recess receiving at least part of the quick disconnect block 130) improves the mechanical stability of the connection between the coolant interface 106 and the quick disconnect interfaces 111, so that the mechanical coupling of the quick disconnect fittings are not stressed by shock and vibration. For such purposes, as well as alignment, more than one alignment pin 134 may be provided on the quick disconnect block 130. For example, a second alignment pin (not shown in FIG. 1C) may be provided diagonally across the region enclosed by the seal 133 from the alignment pin 134 shown in FIG. 1C.

Captive hardware 135 (for example, threaded screws) is mounted on and, in the example of FIG. 1C, extends through the quick disconnect block 130 and is used for assembly. For example, once the flat surface 132 is seated against the counterpart surface of the quick disconnect interface 111 on the coolant distribution manifold 110, the captive hardware 135 may be screwed to be received into threaded holes within the counterpart surface (or otherwise actuated) to secure the attachment. When the captive hardware 135 is not fully engaged, the compression of seal 133 is limited to that induced by the mechanical forces resulting from insertion of the LRU 103 into a chassis assembly slot and the coupling of the quick disconnect fittings. The captive hardware 135 allows the compression on seal 133 to be increased independently of those forces. Although three pieces of captive hardware 135 are shown in the example of FIG. 1C, more or fewer pieces of such hardware may be employed. Moreover, the captive hardware 135 and alignment pin 134 are shown as disposed at the four corners of the rectangular flat surface 132 of the quick disconnect block 130 on which the seal 133 is mounted. When the captive hardware 135 is fully engaged, the alignment pin 134 and the captive hardware 135 contribute to the mechanical stability of the connection. As evident, different arrangements of captive hardware 135 and alignment pin(s) 134 may be employed to achieve similar results.

Figure 2A:
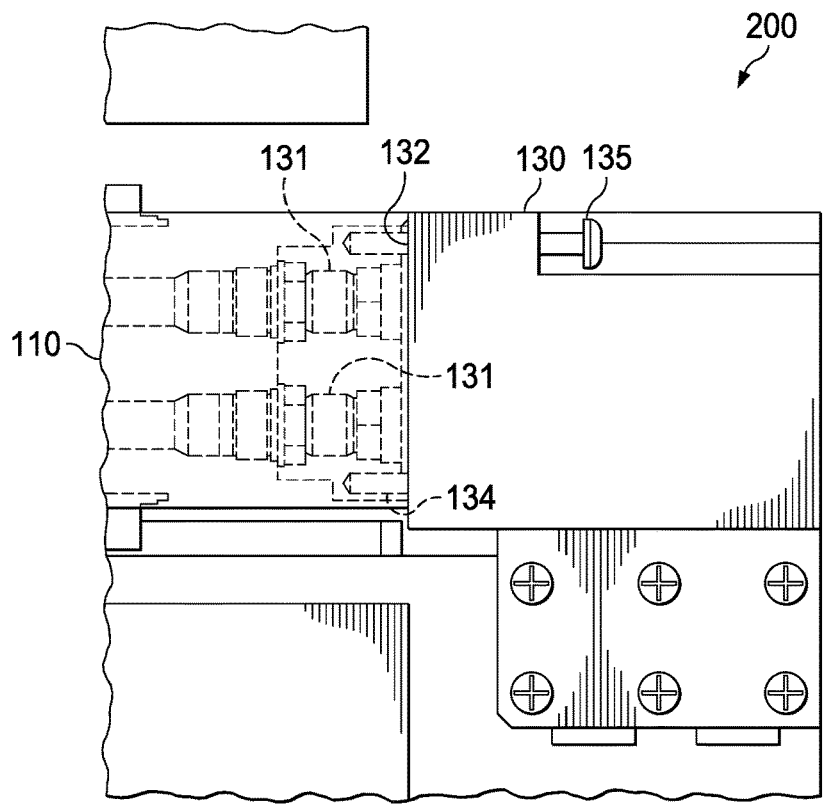
FIGS. 2A through 2C are illustrations showing the operation of the coolant interface of FIGS. 1, 1A, 1B and 1C.
Figure 2B:
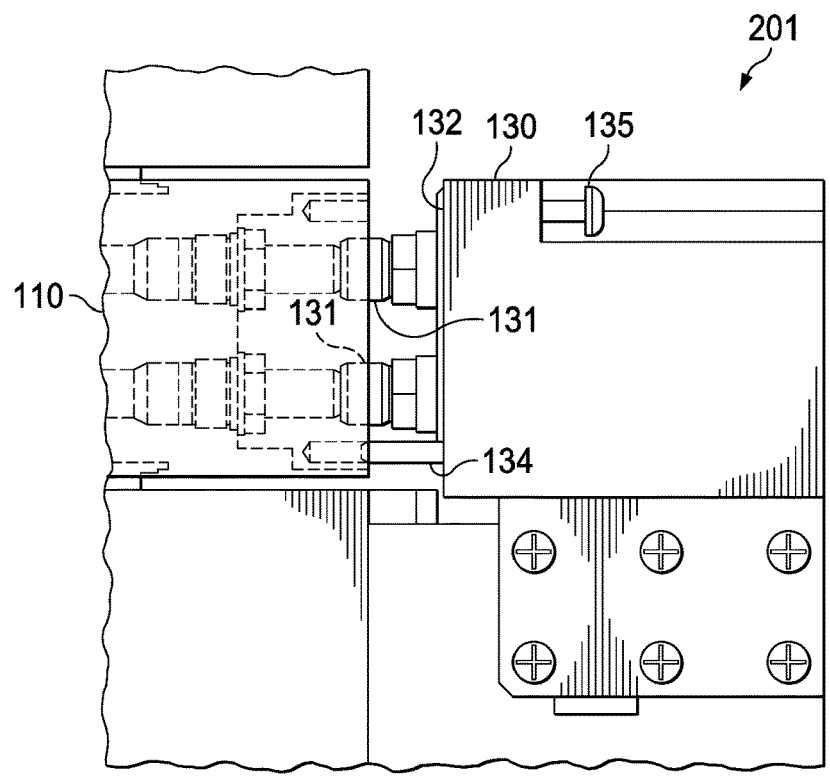
Figure 2C:
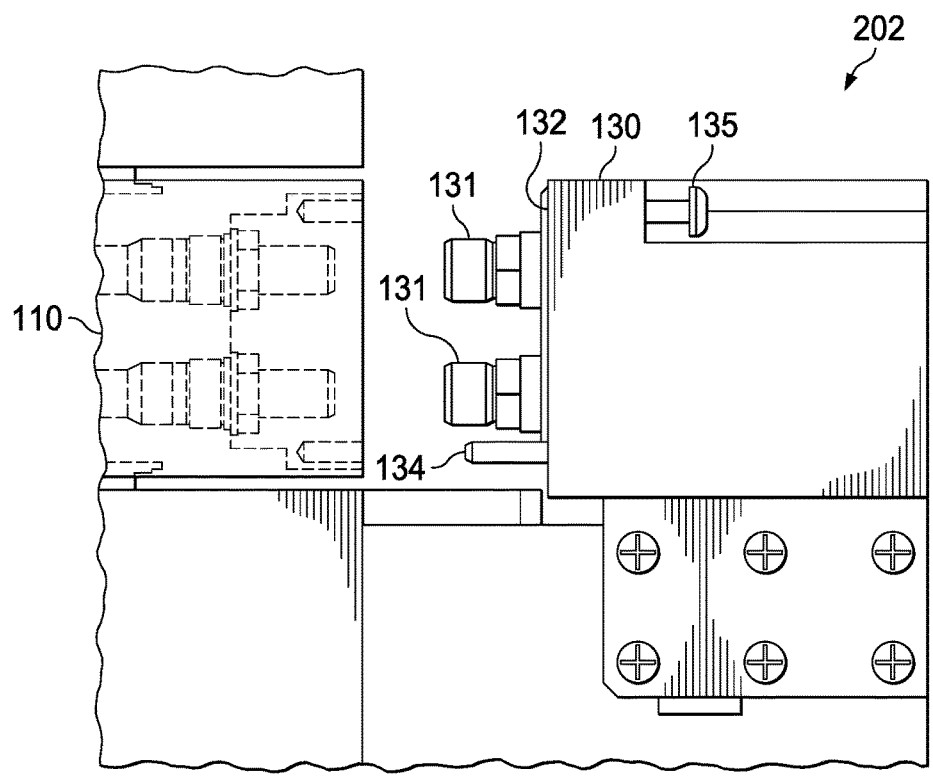

FIGS. 2A through 2C are illustrations showing the operation of the coolant interface of FIGS. 1, 1A, 1B and 1C. FIG. 2A shows the coolant interface in a state 200 in which the flat surface 132 of the quick disconnect block 130 for the coolant interface on the LRU is seated against the counterpart surface of the quick disconnect interface on the coolant distribution manifold 110 of the chassis assembly 101, but with the captive hardware 135 not yet fully engaged. In the state shown, the seal (not visible in FIG. 2A) is at least partially compressed between the flat surface 132 of the quick disconnect block 130 and the counterpart surface of the quick disconnect interface. When the captive hardware 135 is fully engaged, the seal will be further compressed to improve the seal against fluid leaks and ensure leak free operation. As shown in phantom, the alignment pin 134 is fully inserted into the guide hole and the quick disconnect fittings 131 are mated with the counterpart fittings on the quick disconnect interface when the coolant interface is in the state 200 shown in FIG. 2A.

FIG. 2B shows the coolant interface in a state 201 in which the quick disconnect block 130 is beginning to be mated to the quick disconnect interface on the coolant distribution manifold 110 of the chassis assembly 101. During insertion of the LRU 103 into a chassis assembly slot, the alignment pin(s) 134 connect first and the captive hardware 135 connect last, to force compression of the seal 133 between the quick disconnect block 130 and the quick disconnect interface on the coolant distribution manifold 110 of the chassis assembly 101. In the state 201 shown in FIG. 2B, only the tip of the alignment pin 134 is inserted into the guide hole, and the quick disconnect fittings 131 are just beginning to mate with the counterpart fittings on the quick disconnect interface. The alignment pin 134 provides engagement accuracy as the coolant interface is moved to being fully seated as shown in FIG. 2A.

FIG. 2C shows the coolant interface in a state 202 in which the quick disconnect block 130 is fully decoupled from but generally aligned with the quick disconnect interface on the coolant distribution manifold 110 of the chassis assembly 101. The alignment pin 134 is fully out of the guide hole, and the quick disconnect fittings 131 are decoupled from the counterpart fittings on the quick disconnect interface.

The coolant interface of the present disclosure incorporates multiple methods simultaneously to ensure leak proof operation and easy maintenance. The face seals provide proven protection against leaks during pressurized operation, even under extreme shock and vibration conditions, whereas quick disconnects are prone to leak under such circumstances. The quick disconnects, however, allow the LRU to be engaged/disengaged from the cooling system under maintenance conditions without needing to drain the liquid from the system or provide vacuum assisted coolant containment. An alignment pin provides mating accuracy between the coolant interface on the LRU assembly and the RMA chassis fluid distribution manifold.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A line replaceable unit configured to be inserted into a slot within a modular assembly, the line replaceable unit comprising:
   a coolant interface including a quick disconnect block with a flat surface configured to abut a counterpart surface on a fluid distribution manifold within a chassis for the modular assembly when the line replaceable unit is inserted into the slot within the modular assembly, the flat surface including:
   multiple quick disconnect fluid coupling fittings configured to mate with counterpart fittings on the fluid distribution manifold when the line replaceable unit is inserted into the slot within the modular assembly;
   a seal mounted around the multiple quick disconnect fluid coupling fittings on the flat surface, wherein the seal is configured to seal a connection between the flat surface and the counterpart surface; and
   one or more alignment pins projecting from the flat surface and configured to be received by one or more corresponding guide holes within the counterpart surface.

2. The line replaceable unit according to claim 1, wherein the seal comprises an O-ring or a gasket.

3. The line replaceable unit according to claim 1, wherein the quick disconnect block further comprises:
   captive hardware configured to provide pressure between the flat surface and the counterpart surface to increase and maintain compression of the seal between the flat surface and the counterpart surface.

4. The line replaceable unit according to claim 3, wherein the one or more alignment pins and the captive hardware are arranged at four corners of the flat surface surrounding the seal.

5. The line replaceable unit according to claim 3, wherein the one or more alignment pins each have a partially tapered end and the captive hardware comprises threaded screws.

6. The line replaceable unit according to claim 1, further comprising:
   a cooling structure configured to:
   receive coolant from the fluid distribution manifold via at least one of the multiple quick disconnect fluid coupling fittings,
   circulate the coolant proximate to electronics mounted on the line replaceable unit, and
   return the circulated coolant to the fluid distribution manifold via at least one other of the multiple quick disconnect fluid coupling fittings.

7. The line replaceable unit according to claim 6, further comprising:
   one or more heat sinks mounted on the cooling structure and supporting the electronics.

8. The line replaceable unit according to claim 1, wherein the modular assembly is a radar module assembly.

9. A system comprising:
   a modular assembly; and
   a line replaceable unit configured to be inserted into a slot within the modular assembly, the line replaceable unit comprising:
   a coolant interface including a quick disconnect block with a flat surface configured to abut a counterpart surface on a fluid distribution manifold within a chassis for the modular assembly when the line replaceable unit is inserted into the slot within the modular assembly, the flat surface including:
   multiple quick disconnect fluid coupling fittings configured to mate with counterpart fittings on the fluid distribution manifold when the line replaceable unit is inserted into the slot within the modular assembly;
   a seal mounted around the multiple quick disconnect fluid coupling fittings on the flat surface, wherein the seal is configured to seal a connection between the flat surface and the counterpart surface; and
   one or more alignment pins projecting from the flat surface and configured to be received by one or more corresponding guide holes within the counterpart surface;
   wherein the modular assembly comprises:
   the chassis, wherein the chassis includes a plurality of slots each configured to receive the line replaceable unit; and
   the fluid distribution manifold, wherein the fluid distribution manifold includes the counterpart fittings in a plurality of locations each positioned, relative to one of the plurality of slots, to align and mate with the multiple quick disconnect fluid coupling fittings on the line replaceable unit when the line replaceable unit is inserted into the respective one of the plurality of slots.

10. The system according to claim 9, wherein the fluid distribution manifold is configured to circulate coolant to each line replaceable unit inserted into any of the plurality of slots but otherwise retain the coolant.

11. A method of using a line replaceable unit that includes a coolant interface having a quick disconnect block with a flat surface, the method comprising:
   inserting the line replaceable unit into a slot within a modular assembly such that the flat surface abuts a counterpart surface on a fluid distribution manifold within a chassis for the modular assembly;
   inserting one or more alignment pins projecting from the flat surface into one or more corresponding guide holes within the counterpart surface;
   mating multiple quick disconnect fluid coupling fittings on the flat surface of the coolant interface with counterpart fittings on the fluid distribution manifold; and
   compressing a seal, mounted on the flat surface around the multiple quick disconnect fluid coupling fittings, between the flat surface and the counterpart surface on the fluid distribution manifold to seal a connection between the flat surface and the counterpart surface.

12. The method according to claim 11, wherein:
   the seal comprises an O-ring or a gasket.

13. The method according to claim 11, further comprising:
   using captive hardware, providing pressure between the flat surface and the counterpart surface to increase and maintain compression of the seal between the flat surface and the counterpart surface.

14. The method according to claim 13, wherein the one or more alignment pins and the captive hardware are arranged at four corners of the flat surface.

15. The method according to claim 13, wherein the one or more alignment pins each have a partially tapered end and the captive hardware comprises threaded screws.

16. The method according to claim 11, further comprising:
   receiving coolant in a cooling structure for the line replaceable unit from the fluid distribution manifold via at least one of the multiple quick disconnect fluid coupling fittings;
   circulating the coolant proximate to electronics mounted on the line replaceable unit; and
   returning the circulated coolant to the fluid distribution manifold via at least one other of the multiple quick disconnect fluid coupling fittings.

17. The method according to claim 16, wherein the line replaceable unit further comprises:
   one or more heat sinks mounted on the cooling structure and supporting the electronics.

18. The method according to claim 11, wherein:
   the chassis includes a plurality of slots each configured to receive the line replaceable unit, and
   the fluid distribution manifold includes the counterpart fittings in a plurality of locations each positioned, relative to one of the plurality of slots, to align and mate with the multiple quick disconnect fluid coupling fittings on the line replaceable unit when the line replaceable unit is inserted into the respective one of the plurality of slots.

19. The method according to claim 18, further comprising:
   circulating coolant from the fluid distribution manifold to each line replaceable unit inserted into any of the plurality of slots but otherwise retaining the coolant.

20. The method according to claim 11, wherein the modular assembly is a radar module assembly.

* * * * *